US009817066B1

(12) United States Patent
Kuramoto et al.

(10) Patent No.: US 9,817,066 B1
(45) Date of Patent: Nov. 14, 2017

(54) CONFIGURABLE JTAG-TO-SERIAL BUS TRANSLATOR

(71) Applicant: Xilinx, Inc., San Jose, CA (US)

(72) Inventors: Randal M. Kuramoto, San Carlos, CA (US); Stephanie Trapp, San Jose, CA (US); Matthew K. Nielson, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 469 days.

(21) Appl. No.: 14/469,046

(22) Filed: Aug. 26, 2014

(51) Int. Cl.
*G01R 31/3177* (2006.01)

(52) U.S. Cl.
CPC ................ *G01R 31/3177* (2013.01)

(58) Field of Classification Search
CPC .................................................. G01R 31/3177
See application file for complete search history.

(56) References Cited

U.S. PATENT DOCUMENTS

| 5,412,260 | A | * | 5/1995 | Tsui | ................. | G01R 31/31855 326/16 |
| 5,708,773 | A | * | 1/1998 | Jeppesen, III | . | G01R 31/318586 714/30 |
| 6,546,507 | B1 | * | 4/2003 | Coyle | ................... | G06F 11/221 714/32 |
| 7,265,578 | B1 | * | 9/2007 | Tang | .............. | G01R 31/318516 326/40 |
| 7,281,082 | B1 | * | 10/2007 | Knapp | ............. | H03K 19/17772 326/39 |
| 2008/0147901 | A1 | * | 6/2008 | Gloekler | ........ | G01R 31/318555 710/11 |
| 2009/0222251 | A1 | * | 9/2009 | Gloekler | ........ | G01R 31/318555 703/14 |
| 2010/0061166 | A1 | * | 3/2010 | Tan | ......................... | G11C 29/02 365/194 |
| 2010/0223519 | A1 | * | 9/2010 | Swoboda | ......... | G01R 31/31705 714/733 |
| 2012/0331330 | A1 | * | 12/2012 | Gaskins | .................... | G06F 5/06 713/401 |
| 2013/0212445 | A1 | * | 8/2013 | Doerr | .................... | G06F 11/267 714/727 |

OTHER PUBLICATIONS

Xilinx, Inc., *Using SPI Flash with 7 Series FPGAs*, XAPP586 (v1.2), Jan. 31, 2014, pp. 1-17, Xilinx, Inc., San Jose, California, USA.
Xilinx, Inc., *XC3S700AN Flash Programmer*, (Rev1), Nov. 20, 2007, pp. 1-35, Xilinx, Inc., San Jose, California, USA.

\* cited by examiner

*Primary Examiner* — Nimesh G Patel
(74) *Attorney, Agent, or Firm* — Robert M. Brush

(57) ABSTRACT

A circuit couples a test access port (TAP) having a JTAG interface to another port having a serial interface different from the JTAG interface. The circuit includes a forwarding circuit and a timing control circuit. The forward circuit is coupled to couple a test data in (TDI) terminal, a test data out (TDO) terminal, and a test clock (TCK) terminal of the TAP to an input terminal, an output terminal, and a clock terminal of the another port, respectively. The timing control circuit is coupled to drive a select terminal of the another port with a select signal that activates serial data transfer through the serial interface to a device. The timing control circuit delays assertion of the select signal by a configurable time period after assertion of a shift data state of a state machine of the TAP.

20 Claims, 8 Drawing Sheets

CONFIGURABLE JTAG-TO-SERIAL BUS TRANSLATOR

TECHNICAL FIELD

Examples of the present disclosure generally relate to electronic circuits and, in particular, to a configurable JTAG-to-serial bus translator.

BACKGROUND

Systems often implement a collection of different interconnect interfaces for inter-device control and communication. Two popular interconnect interfaces include an interface established by the Joint Test Action Group (JTAG) referred to as the "JTAG interface", and a de facto standard interface known as the Serial Peripheral Interface (SPI). The JTAG interface is incorporated into IEEE 1149.1, which is a standard defining boundary scan test logic for integrated circuits (ICs). While the JTAG and SPI interfaces generally have similar control and communication functionality, the interfaces themselves and the protocols used to transfer data are different.

It is often preferred that one master controller controls and communicates with the peripheral devices in a system. When the peripheral devices have different interfaces (e.g., JTAG, SPI, etc.), a bridge circuit can be employed to bridge control and communication from one kind of interface to another kind of interface. Prior implementations of bridges that translate between JTAG and SPI interfaces involve memory buffers for storing control tasks and data, and a sequencer state machine or microprocessor. With such bridges, control or communication transactions from one interface are buffered and handed to the bridge circuit, and the bridge circuit reconstructs the equivalent transaction for the other interface. Such bridges can require significant memory and logic resources, and can add significant latency between transactions, particularly round-trip transactions (e.g., request and response transactions).

SUMMARY

A configurable JTAG-to-serial bus translator is described. In an example implementation, a circuit is provided to couple a test access port (TAP) having a JTAG interface to another port having a serial interface different from the JTAG interface. The circuit includes a forwarding circuit and a timing control circuit. The forward circuit is coupled to couple a test data in (TDI) terminal, a test data out (TDO) terminal, and a test clock (TCK) terminal of the TAP to an input terminal, an output terminal, and a clock terminal of the another port, respectively. The timing control circuit is coupled to drive a select terminal of the another port with a select signal that activates serial data transfer through the serial interface to a device. The timing control circuit delays assertion of the select signal by a configurable time period after assertion of a shift data state of a state machine of the TAP.

In another example implementation, a slave JTAG device on a JTAG bus having a master JTAG device is provided, the slave JTAG device coupled to another device on a serial bus different from the JTAG bus. The slave JTAG device includes a TAP coupled to the JTAG bus; another port coupled to the serial bus; and a bus translator circuit coupled between the TAP and the another port. The bus translator circuit includes a forwarding circuit and a timing control circuit. The forwarding circuit is coupled to couple a TDI path, a TDO path, and a TCK path of the JTAG bus to an input path, an output path, and a clock path of the serial bus, respectively. The timing control circuit is coupled to a select path of the serial bus used to activate the other device for serial data transfer, and further coupled to a controller in the TAP to access to a shift data state of a state machine implemented by the controller. The timing control circuit is coupled to delay assertion of the select signal by a configurable time period after assertion of the shift data state.

In another example implementation, a method of coupling a JTAG interface and a serial interface different from the JTAG interface in a device includes forwarding a TDI signal and a TCK signal of the JTAG interface as an input signal and a clock signal, respectively, of the serial interface; forwarding an output signal of the serial interface as a TDO signal of the JTAG interface; monitoring a shift data state of a state machine that controls data transfer through the JTAG interface; and generating a select signal that activates another device coupled to the serial interface for serial data transfer. The select signal is asserted a configurable time period after assertion of the shift data state.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

A configurable JTAG-to-serial bus translator for a device is described. In an example implementation, a device, such as an integrated circuit (IC), includes a bus translator circuit coupled between a test access port (TAP) to a JTAG bus and a serial port to a separate serial bus distinct from the JTAG bus ("other serial bus"). In one example, the other serial bus comprises an SPI bus such that the bus translator circuit is a JTAG-to-SPI bus translator circuit. In general, the bus translator circuit leverages similarities between the low-level data transfer protocols of the JTAG interface and other serial interface. The bus translator circuit couples test data in (TDI), test data out (TDO), and test clock (TCK) paths of the JTAG bus to input, output, and clock paths of the other serial bus, respectively. Input, output, and clock signals can be forwarded directly between the JTAG interface and the other serial interface without signal manipulation or buffering. For example, commands and data can be sent through the JTAG bus and directly forwarded to the SPI bus, and return data can be sent through the SPI bus and directly forwarded to the JTAG bus. The bus translator circuit can compensate for differences of data alignment on the TDI path of the JTAG bus and the input data path of the other serial bus, which can vary based on JTAG bus topology. The bus translator circuit is efficient, can be implemented with minimal logic resources, and introduces little or no latency. These and other aspects are described below with respect to the following figures and description.

Figure 1:
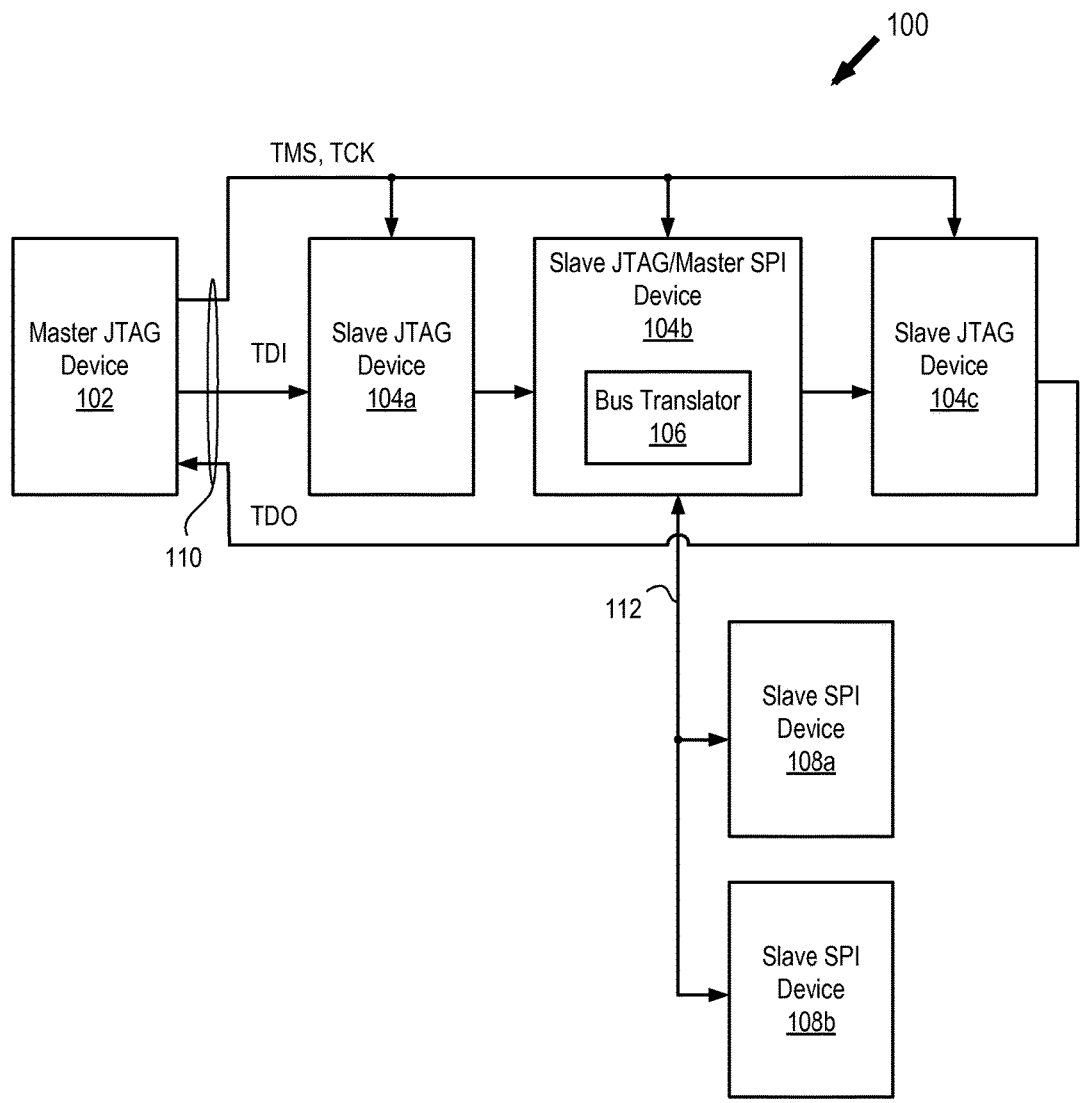
FIG. 1 is a block diagram of a system of interconnected devices.

FIG. 1 is a block diagram of an example system 100 of interconnected devices. The devices in the system 100 generally include a plurality of integrated circuits (ICs). The system 100 includes a master JTAG device 102 and one or more slave JTAG devices, e.g., slave JTAG devices 104a, 104b, and 104c (collectively "slave JTAG devices 104" or generally "slave JTAG device 104"). The master JTAG device 102 and the slave JTAG devices 104 are daisy chained by a JTAG bus 110. The JTAG bus 110 includes test data in (TDI), test data out (TDO), test clock (TCK), and test mode select (TMS) paths. The TDI, TCK, TMS, and TDO signals comprise the well-known JTAG interface and are further described in IEEE 1149.1. The JTAG bus can include other signals, such as test reset (TRST) (not shown).

The system 100 also includes a master SPI device and one or more slave SPI devices, e.g., slave SPI devices 108a and 108b (collectively "slave SPI devices 108" or generally "slave SPI device 108"). One of JTAG devices in the system 100 functions as the master SPI device, e.g., the slave JTAG device 104b. The master SPI device (slave JTAG device 104b) and the slave SPI devices 108 are coupled to an SPI bus 112. The SPI bus 112 includes master-out/slave-in (MOSI), master-in/slave-out (MISO), serial clock (SCK), and chip select (CS) paths. The SPI bus 112 can include one or more CS paths (e.g., CS1, CS2, etc.) for each of the one or more slave SPI devices 108 on the SPI bus 112. The MOSI, MISO, SCK, and CS signals comprise the well-known SPI interface.

The system 100 further includes a bus translator 106 in the master SPI device (e.g., the salve JTAG device 104b). The bus translator 106 provides an interface between the JTAG bus 110 and the SPI bus 112. The bus translator 106 forwards data and commands from the JTAG bus 110 to intended slave SPI device(s) 108 on the SPI bus 112 (e.g., data and commands generated by the master JTAG device 102). The bus translator 106 also forwards return data from SPI device(s) 108 on the SPI bus 112 to the JTAG bus 110. The master JTAG device 102 can enable the bus translator 106 with a special JTAG instruction. When the bus translator 106 is enabled, the master JTAG device 102 instructs the other slave JTAG devices to be in a bypass state. In this manner, the master JTAG device 102 can send SPI data and commands intended for a slave SPI device 108, and receive SPI data from a slave SPI device 108, over the JTAG bus. Example implementations of the bus translator 106 are described below.

Figure 2:
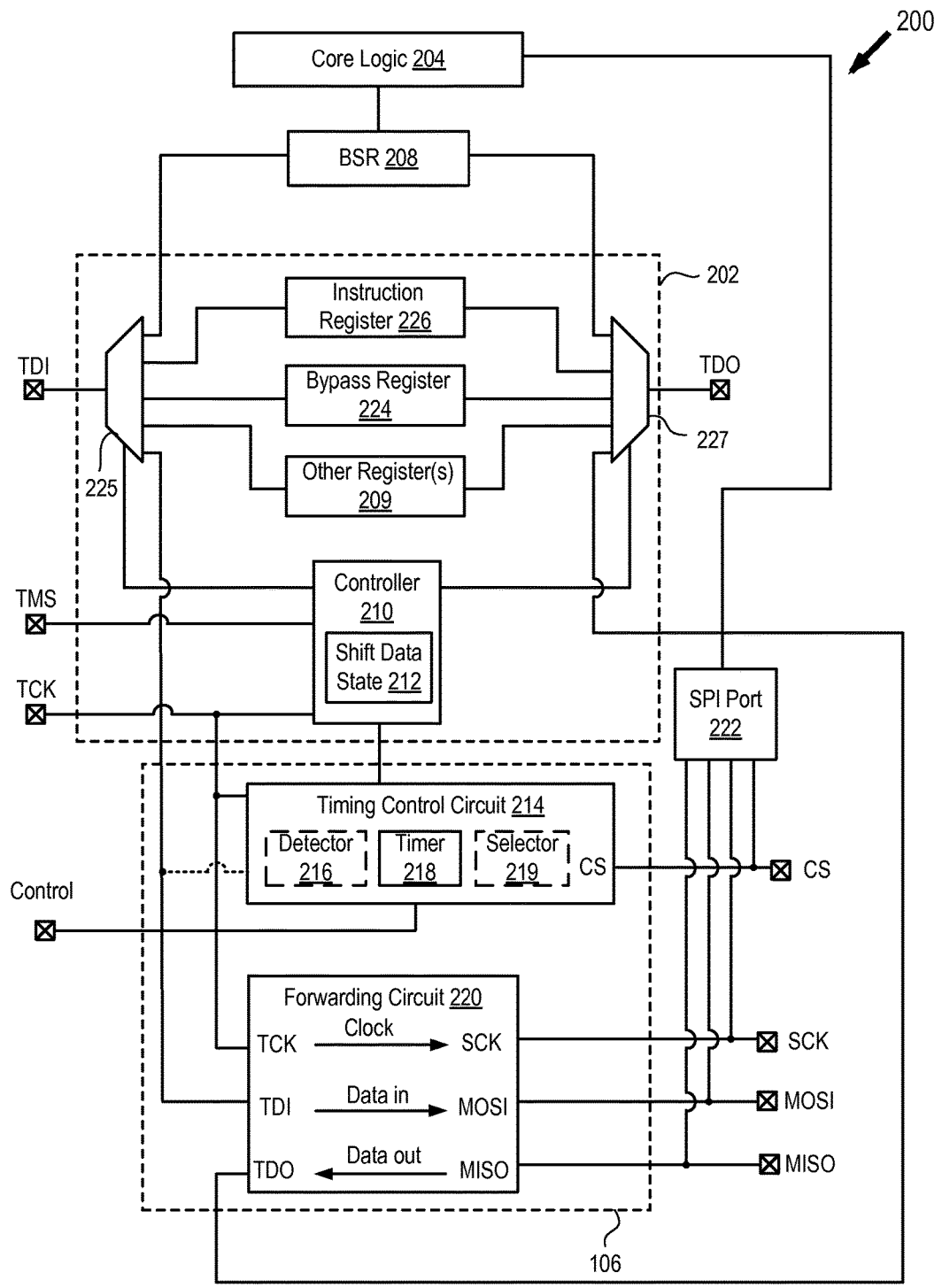
FIG. 2 is a block diagram of a device having multiple interconnect interfaces.

FIG. 2 is a block diagram of an example device 200 having multiple interconnect interfaces. The device 200 can be an example of the slave JTAG device 104b of FIG. 1 that includes interfaces to both the JTAG bus 110 and the SPI bus 112. The device 200 includes a test access port (TAP) 202, core logic 204, a plurality of serially coupled boundary scan cells ("boundary scan register (BSR) 206"), the bus translator 106, and an SPI port 222. The core logic 204 comprises various circuits implementing the core functionality of the device 200. In general, the TAP 202 is coupled to a JTAG bus and is coupled to receive data and commands and provide return data. The bus translator 206 provides an interface between the TAP 202 and an SPI bus. The bus translator 206 forwards data and commands from the JTAG bus to the SPI bus for a destination device on the SPI bus. The bus translator 206 also forwards return data from a device on the SPI bus to the JTAG bus.

The TAP 202 includes TDI, TCK, TMS, and TDO terminals coupled to the TDI, TCK, TMS, and TDO paths of the JTAG bus. The TAP 202 controls various registers, such as the BSR 208, an instruction register 226, a bypass register 224, and other register(s) 209 (e.g., an ID register). The TAP 202 includes a controller 210 that controls operation of the TAP 202. The controller 210 implements a state machine having a plurality of states that control setting and retrieving information from a selected register. Transitions between states of the controller 210 are controlled by the TMS signal sampled according to the TCK signal. The controller 210 is coupled to control terminals of multiplexers 225 and 227. The multiplexer 225 selectively couples the TDI terminal to an input of one of the registers, and the multiplexer 227 selectively couples the TDO terminal to an output of one of the registers. Initially, the controller 210 can couple the TDI terminal to the instruction register 226 to receive an instruction. The controller 210 then couples the TDI terminal to another data input in response to the instruction, such as the BSR 208, the bypass register 224, another register 209, or the bus translator 106. The controller 210 can select the bus translator 106 in response to designated JTAG instruction for such purpose. The controller 210 likewise couples the TDO terminal to another data output in response to the instruction. The states of the controller 210 are described in detail in the IEEE 1149.1 standard and are well-known. In particular, the controller 210 includes a shift data state 212, which controls when data is shifted into one of the data registers. Serial data transfers occur when the shift data state 212 is in an active logic state (e.g., active logic low according to IEEE 1149.1). The bypass register 224 is typically a 1-bit register that allows information on the JTAG bus intended for another device on the chain to bypass the device 200.

Inputs of the BSR 208, the bypass register 224, the other register(s) 208, and the bus translator 106 are coupled to outputs of the multiplexer 225 to receive the TDI signal. Outputs of the BSR 208, the bypass register 224, the other register(s) 208, and the bus translator 106 are coupled to inputs of the multiplexer 227 to provide the TDO signal. The core logic 204 can be coupled to the BSR 208. Inputs of the controller 210 are coupled to the TCK and TMS terminals for receiving TCK and TMS signals, respectively. An input of the bus translator 106 is also coupled to the TCK terminal for receiving the TCK signal. An input of the bus translator 106 is coupled to the controller 210 for receiving a signal representing the shift data state 212.

The SPI port 222 includes MOSI, MISO, SCK, and CS terminals respectively coupled to MOSI, MISO, SCK, and CS paths of the SPI bus. The core logic 204 can be coupled to the SPI port 222 for communication with devices on the SPI bus. Well known circuitry of the SPI port 222 has been omitted for clarity.

The bus translator 106 includes a timing control circuit 214 and a forwarding circuit 220. The forwarding circuit 220 couples the TDI, TCK, and TDO terminals of the TAP 202 to the MOSI, SCK, and MISO terminals of the SPI port 222, respectively. In an example, the forwarding circuit 220 directly connects the TDI, TCK, and TDO data paths of the JTAG bus to the MOSI, SCK, and MISO data paths, respectively, of the SPI bus. No buffers or other type of signal processing is required in the forwarding circuit 220. The forwarding circuit 220 can include various switch circuits and/or connector circuits (not shown). The timing control circuit 214 is coupled to the CS terminal(s) of the SPI port 222. In general, the timing control circuit 214 generates a CS signal based on the shift data state 212 of the controller 210. The timing control circuit 214 couples the CS signal to a CS terminal. The timing control circuit 214 compensates for differences in data alignment between the TDI path and the MOSI path, which depend on the topology of the JTAG bus.

The clock and data signal functions are similar between the JTAG interface and the SPI interface. Both the JTAG interface and the SPI interface include a clock signal. For the TDI data input signal of the JTAG interface, data transitions on the falling edge of the clock and is captured on the rising edge of the clock. Likewise for the MOSI data input signal of the SPI interface. For the TDO data output signal of the JTAG interface, data transitions on the falling edge of the clock and is captured on the rising edge of the clock. Likewise for the MISO data output signal of the SPI interface. One difference between the JTAG interface and the SPI interface is the activation of serial data transfer. The JTAG interface activates the interface for serial data transfer via the shift data state 212. The SPI interface activates the interface for serial data transfer via a CS signal. When multiple JTAG devices are connected in a chain, the respective state machines operate in unison. When the shift data state transitions to an active logic state, a given JTAG device in the chain will receive one or more bits associated with other JTAG device(s) on the chain, and then the JTAG device will receive the intended data. The timing control circuit 214 selectively controls the CS signal, potentially compensating for extra bit(s) in the TDI data path, and enables the direct connection of the TDI, TCK, and TDO JTAG paths to the MOSI, SCK, and MISO SPI paths, respectively.

Figure 3A:
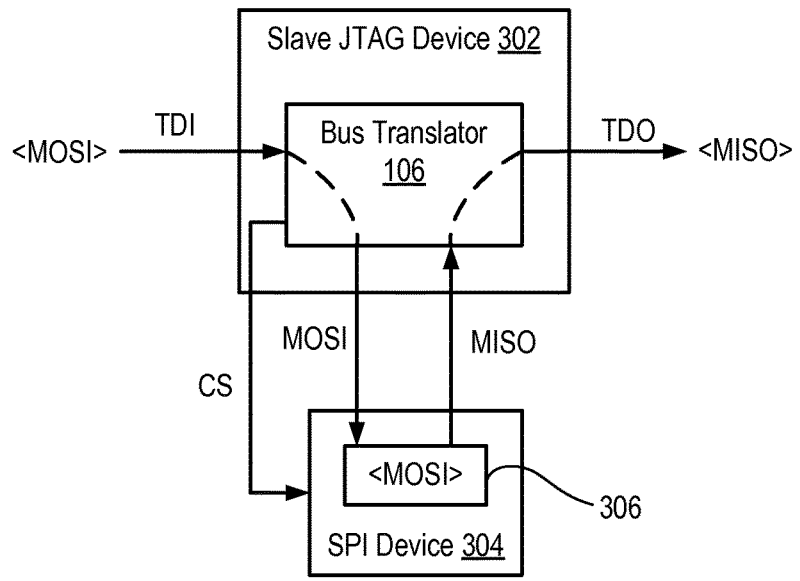
FIG. 3A illustrates data and control flow for a device topology.

FIG. 3A illustrates data and control flow for an example device topology. The device topology includes a single slave JTAG device 302 on the JTAG bus. The slave JTAG device 302 is also coupled to an SPI bus having a single SPI device 304. The slave JTAG device 302 includes the bus translator 106 to provide an interface between the JTAG bus and the SPI bus. A JTAG controller enables the bus translator 106 with the designated JTAG instruction (e.g., a master JTAG device) and generates data, designated <MOSI>, intended for the SPI device 304. The slave JTAG device 302 receives the data on the TDI path. The bus translator 106 forwards the data from the TDI path to the MOSI path of the SPI bus. The bus translator 106 also asserts a CS signal on the CS path of the SPI bus. The SPI device 304 receives the data in a circuit 306 and outputs return data, designated <MISO>. The slave JTAG device 302 receives the return data on the MISO path. The bus translator 106 forwards the return data from the MISO path to the TDO path of the JTAG bus. Since the topology of the present example includes only a single slave JTAG device 302, the data on the TDI path does not include extra bits associated with other devices on the JTAG bus. Thus, at the time when the shift data state in the TAP controller of the slave JTAG device 302 transitions to the active logic state, the data on the TDI path is valid for the SPI device 304. That is, data alignment between the TDI path of the JTAG bus and the MOSI path of the SPI bus is the same.

Figure 3B:
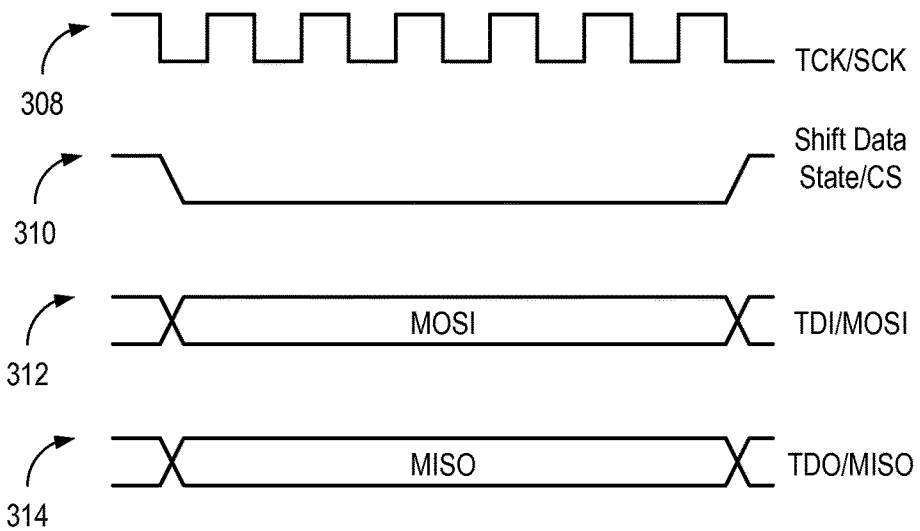
FIG. 3B illustrates signal waveforms in the example topology of FIG. 3A.

FIG. 3B illustrates signal waveforms in the example topology of FIG. 3A. A signal waveform 308 represents the clock signals TCK/SCK of the JTAG/SPI interfaces. A signal waveform 310 represents shift data state/CS signal of the JTAG/SPI interfaces. A signal waveform 312 represents the input data signals TDI/MOSI of the JTAG/SPI interfaces. A signal waveform 314 represents the output data signals TDO/MISO of the JTAG/SPI interfaces. In the example topology having only a single slave JTAG device 302, the TCK, shift data state, TDI, and TDO signals directly correlate with the SCK, CS, MOSI, and MISO signals. This assumes that both the shift data state and the CS signal both employ an active logic low state, which is typically the case. In general, all that is required is for both the shift data state and the CS signal to employ the same active logic state to enable direct use of the shift data state as the CS signal in the single JTAG device topology.

Figure 4A:
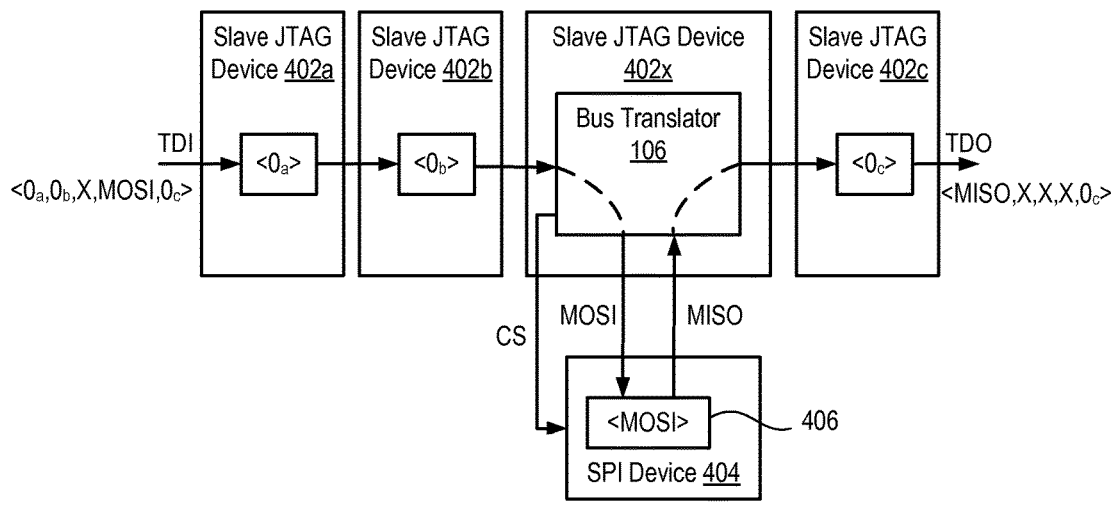
FIG. 4A illustrates data and control flow for another device topology.

FIG. 4A illustrates data and control flow for another example device topology. The device topology includes four slave JTAG devices 402a, 402b, 402x, and 402c on the JTAG bus. Slave JTAG device 402a is connected to slave JTAG device 402b, which is connected to slave JTAG device 402x, which is connected to slave JTAG device 402c. The slave JTAG device 402x is also coupled to an SPI bus having a single SPI device 404. The slave JTAG device 402x includes the bus translator 106 to provide an interface between the JTAG bus and the SPI bus. A JTAG controller (e.g., a master JTAG device) enables the bus translator 106 with the designated JTAG instruction and enables the bypass register in each of the slave JTAG devices 402a, 402b, and 402c. The JTAG controller generates data, designated <$0_a$, $0_b$,X,MOSI,$0_c$>, where only <MOSI> is intended for the SPI device 404. Each of the slave JTAG devices 402a, 402b, and 402c are configured for bypass and each store a single bit in a bypass register. The data <$0_a$>, <$0_b$>, and <$0_c$> are extra bits associated with slave JTAG devices 402a, 402b, and 402c, respectively. The data <X> indicates an arbitrary bit (can be either logic '0' or logic '1'). The bus translator 106 forwards the data from the TDI path to the MOSI path of the SPI bus. The bus translator 106 also asserts a CS signal on the CS path of the SPI bus. The SPI device 404 receives the data in a circuit 406 and outputs return data, designated <MISO>. The slave JTAG device 402x receives the return data on the MISO path. The bus translator 106 forwards the return data from the MISO path to the TDO path of the JTAG bus. The slave JTAG device 402c provides the data designated <MISO,X,X,X,$0_c$>, where <$0_c$> is the bit previously stored in the bypass register of the slave JTAG device 402c, <X> indicates arbitrary bit, and <MISO> indicates MISO data provided by the SPI device 404.

Figure 4B:
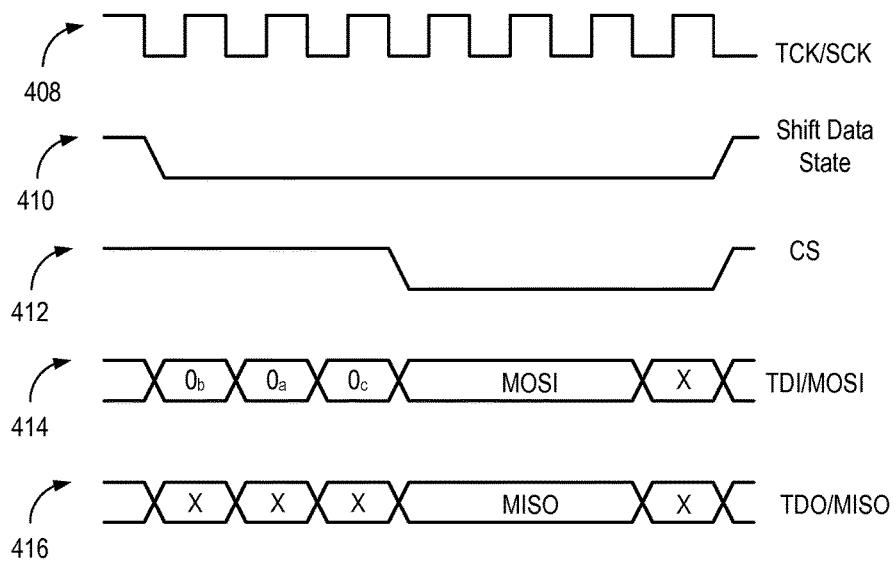
FIG. 4B illustrates signal waveforms for the example topology of FIG. 4A.

FIG. 4B illustrates signal waveforms at the slave JTAG device 402x for the example topology of FIG. 4A. A signal waveform 408 represents the clock signals TCK/SCK of the JTAG/SPI interfaces. A signal waveform 410 represents the shift data state of the state machines in the slave JTAG devices 402a, 402b, 402x, and 402c. A signal waveform 412 represents the CS signal of the SPI interface. A signal waveform 414 represents the input data signals TDI/MOSI of the JTAG/SPI interfaces at the slave JTAG device 402x.

A signal waveform 416 represents the output data signals TDO/MISO of the JTAG/SPI interfaces at the slave JTAG device 402x. As noted above, the shift data state will transition to the active logic state in unison for the slave JTAG devices 402a, 402b, 402x, and 402c. The data on the TDI path at the slave JTAG device 402x will contain extra bits from/for the other slave JTAG devices 402a, 402b, and 402c.

In the example, the slave JTAG device 402x receives <$0_b$> initially stored in the bypass register of slave JTAG device 402b the first clock cycle after the shift data state is asserted. In the next clock cycle, the slave JTAG device 402x receives <$0_a$> initially stored in the bypass register of slave JTAG device 402a. In the next clock cycle, the slave JTAG device 402x receives <$0_c$> intended for the bypass register of slave JTAG device 402c. In the next clock cycle, the slave JTAG device 402a receives a first bit of the data <MOSI> intended for the SPI device 402.

The bus translator 106 forwards the data from the TDI path to the MOSI path of the SPI bus. However, the bus translator 106 delays transition of the CS signal to the active logic state to compensate for the extra bit(s) associated with the other slave JTAG devices 402a, 402b, and 402c. The bus translator 106 transitions the CS signal to the active logic state some number of clock cycles after the shift data state transitions to the active logic state, which is three clock cycles in the present example. In this manner, the SPI device 402 receives the data <MOSI> when the CS signal is asserted and not any extra bits associated with other JTAG devices. If the CS signal is asserted earlier, the SPI device 402 would receive extra bit(s) ahead of the data <MOSI>, which can corrupt the intended input data <MOSI>.

During the time the shift data state is asserted and the CS signal remains de-asserted, TDO of the slave JTAG device 402x outputs three arbitrary data bits <X>. Once the CS signal is asserted, TDO of the slave JTAG device 402x outputs bits of the data <MISO>. In order to ensure all bits of <MISO> are output from the chain, the JTAG controller must clock-in the same number of bits on TDI as required on TDO. Accordingly, the JTAG controller clocks-in bits <$0_a$, $0_b$,X> after MOSI to ensure that all bits of MISO are clocked out from the slave JTAG device 402c. The SPI device 404 can ignore the bit <X>, as the original data/command <MOSI> has already been received and processed. When the last clock cycle shifts out the last bit of the data <MISO> from the slave JTAG device 402c, an arbitrary bit <X> is shifted into the bypass register of the slave JTAG device 402c, becoming the value <$0_c$>.

Returning to FIG. 2, in an example implementation, the timing control circuit 214 includes a timer 218. The timer 218 is configured with a threshold delay (e.g., threshold cycle count). The timer 218 begins counting clock cycles when the shift data state 212 transitions to the active logic state. When elapsed time reaches the threshold delay (e.g., the cycle count reaches the threshold cycle count), the timer 218 asserts the CS signal. In one example, the timer 218 can be configured with a threshold delay through an external control signal received at a control terminal of the bus translator 106. For example, the control signal can be generated by a master JTAG device. The control signal can configure the threshold delay depending on the number of slave JTAG devices on the chain.

In another example, the timer control terminal is omitted or is left unused. In favor of the timer control signal, the timing control circuit 214 includes a detector 216 that configures the threshold delay of the timer 218. The detector 216 receives data from the TDI terminal of the TAP 202. The detector 216 is coupled to detect a predefined pattern in the TDI signal. For example, the master JTAG device can transmit a calibration pattern upon initialization or reset. The detector 216 looks for the calibration pattern, counting cycles from the time of reset until the calibration pattern is detected. The detector then configures the timer 218 with the threshold delay.

In another example, the timer 218 is omitted or is left unused. In favor of the timer 218, the timing control circuit 214 includes the detector 216. The detector is coupled to detect a predefined pattern in the TDI signal that is transmitted each time data is intended for the SPI bus. For example, the master JTAG device can transmit a header pattern before data intended for the SPI bus. The detector 216 looks for the header pattern, and asserts the CS signal upon detection of the header pattern.

Figure 8:
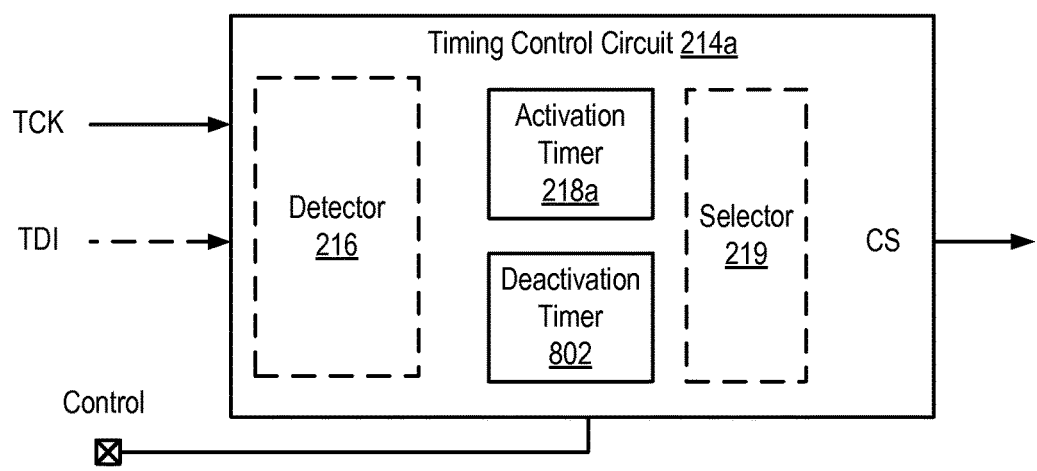
FIG. 8 is a block diagram depicting an alternative timing control circuit.

FIG. 8 is a block diagram depicting an example timing control circuit 214a. The timing control circuit 214a is an alternative implementation of the timing control circuit 214 shown in FIG. 2. In the timing control circuit 214a, the timer 218 becomes an activation timer 218a and functions as described above. The timing control circuit 214a can set the activation timer 218a in response to an external control signal, or in response to output from the detector 216, as described above for the timer 218. The timing control circuit 214a also includes a deactivation timer 802. The deactivation timer 802 controls de-assertion of the CS signal. The deactivation timer 802 can be uses to de-assert the CS signal prior to de-assertion of the shift data state. This allows the data <MOSI> and <MISO> to be perfectly aligned with the CS signal so that the SPI device does not receive any extra bit(s) after <MOSI> that are a by-product of the extra cycle(s) needed to shift all bits of <MISO> from the JTAG chain. The deactivation timer 802 can be set through an external control signal (e.g., provided by the JTAG controller). The control signal can configure the delay of the deactivation timer 802 depending on the number of slave JTAG devices later in the chain (e.g., one clock cycle in the example of FIGS. 4A, 4B for the slave JTAG device 402c).

Figure 5:
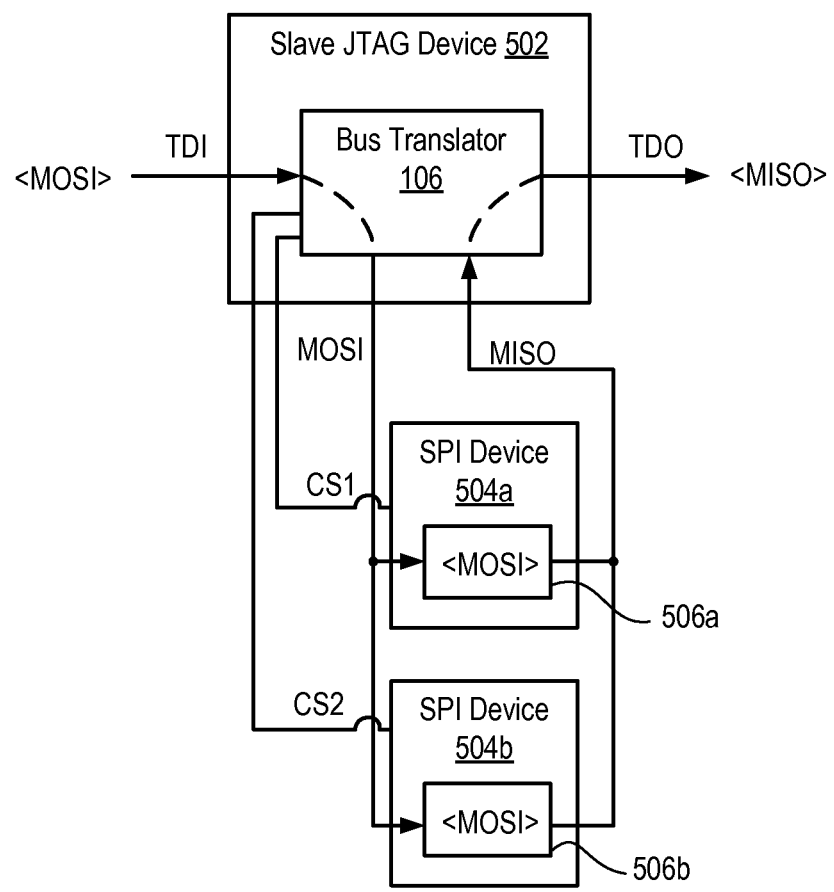
FIG. 5 illustrates data and control flow for a device topology having multiple slave devices on the SPI bus.

In some examples, the SPI bus can include more than one slave device thereon. FIG. 5 illustrates data and control flow for a device topology having multiple slave devices on the SPI bus according to an example implementation. The device topology includes a single slave JTAG device 502 on the JTAG bus. The slave JTAG device 502 is also coupled to an SPI bus having SPI devices 504a and 504b. The slave JTAG device 502 includes the bus translator 106 to provide an interface between the JTAG bus and the SPI bus. A JTAG controller (e.g., a master JTAG device) generates data, designated <MOSI>, intended for one of the SPI devices 504a or 504b. The slave JTAG device 502 receives the data on the TDI path. The bus translator 106 forwards the data from the TDI path to the MOSI path of the SPI bus. The bus translator 106 also asserts a CS signal on either a CS1 path or a CS2 path of the SPI bus, depending on which SPI device 504a or 504b is being addressed. The SPI device 504a or 504b receives the data in a circuit 506a or 506b and outputs return data, designated <MISO>. The slave JTAG device 502 receives the return data on the MISO path. The bus translator 106 forwards the return data from the MISO path to the TDO path of the JTAG bus. Since the topology of the present example includes only a single slave JTAG device 502, the data on the TDI path does not include extra bits associated with other devices on the JTAG bus. However, in other examples, a topology includes multiple slave JTAG devices, at least one of which is coupled to multiple SPI devices.

Returning to FIG. 2, the timing control circuit 214 can include a selector 219. The selector 219 selectively couples the CS signal to one of the CS paths on the SPI bus in cases where the SPI bus includes multiple CS paths for multiple SPI devices on the bus. In an example, the selector 219 can select a particular CS path based on an external command (e.g., received from the control terminal of the timing control circuit 214). In another example, the selector 219 can select a particular CS path based on output of the detector 216. As described above, the detector 216 can detect a calibration pattern or header pattern, which can include an indication of which SPI device to select. The selector 219 couples the CS signal to the appropriate CS path based on the indication in the calibration pattern or header pattern as detected by the detector 216.

Figure 6:
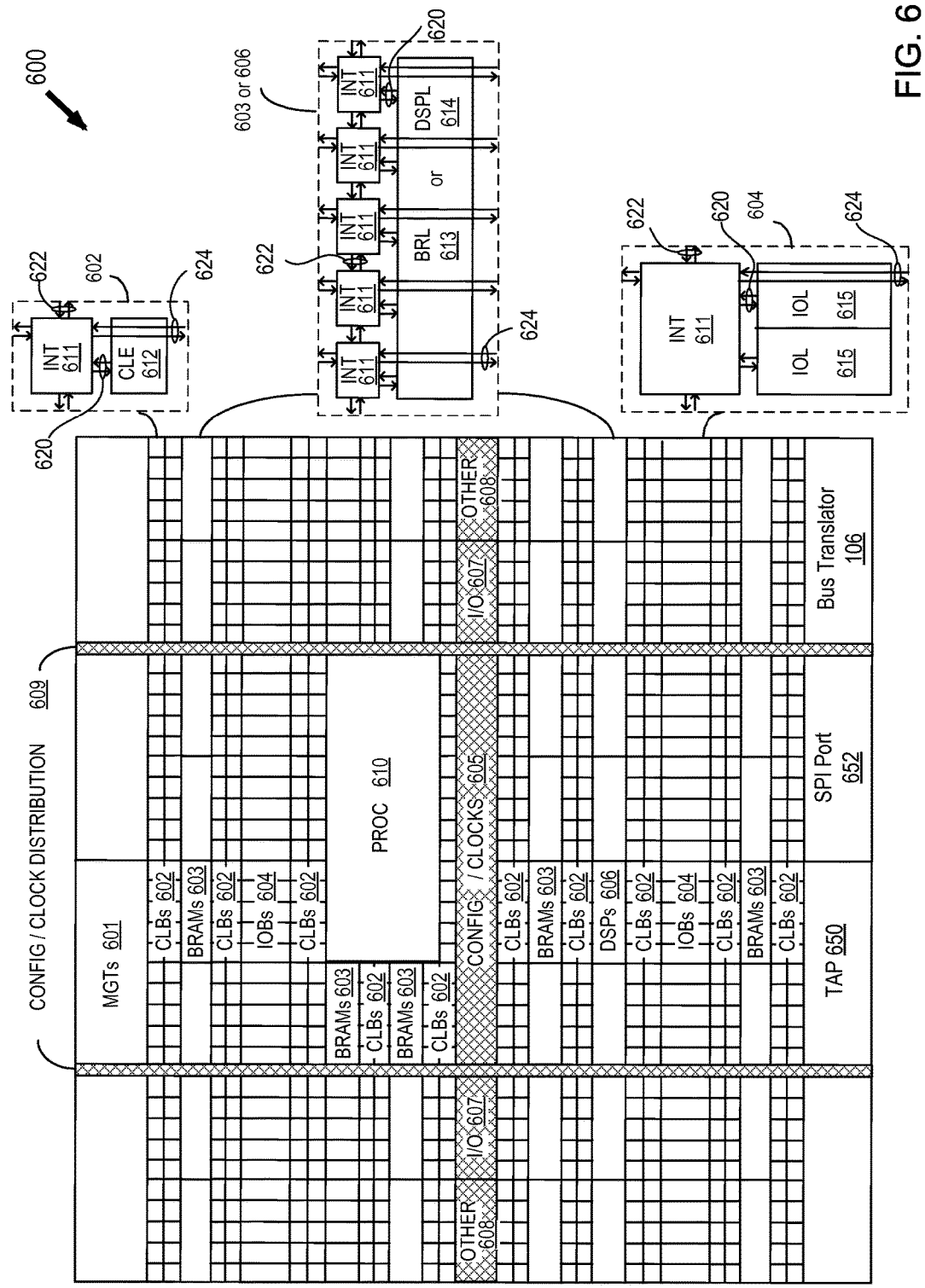
FIG. 6 illustrates a field programmable gate array (FPGA) architecture.

The bus translator 106 can be used in any type of IC that includes both JTAG and SPI interfaces. In an example, the bus translator 106 can be used in a programmable IC, such as a field programmable gate array (FPGA). FIG. 6 illustrates an example FPGA architecture 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611.

As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The FPGA 600 can include a TAP 650 to provide a JTAG interface and an SPI port 652 to provide an SPI interface. The FPGA 600 can include the bus translator 106 to provide an interface between the JTAG and SPI interfaces, as described above. In one example, the bus translator 106 comprises a dedicated circuit formed alongside the FPGA 600. In another example, at least a portion of the bus translator 106 can be configured using programmable logic of the FPGA 600.

Figure 7:
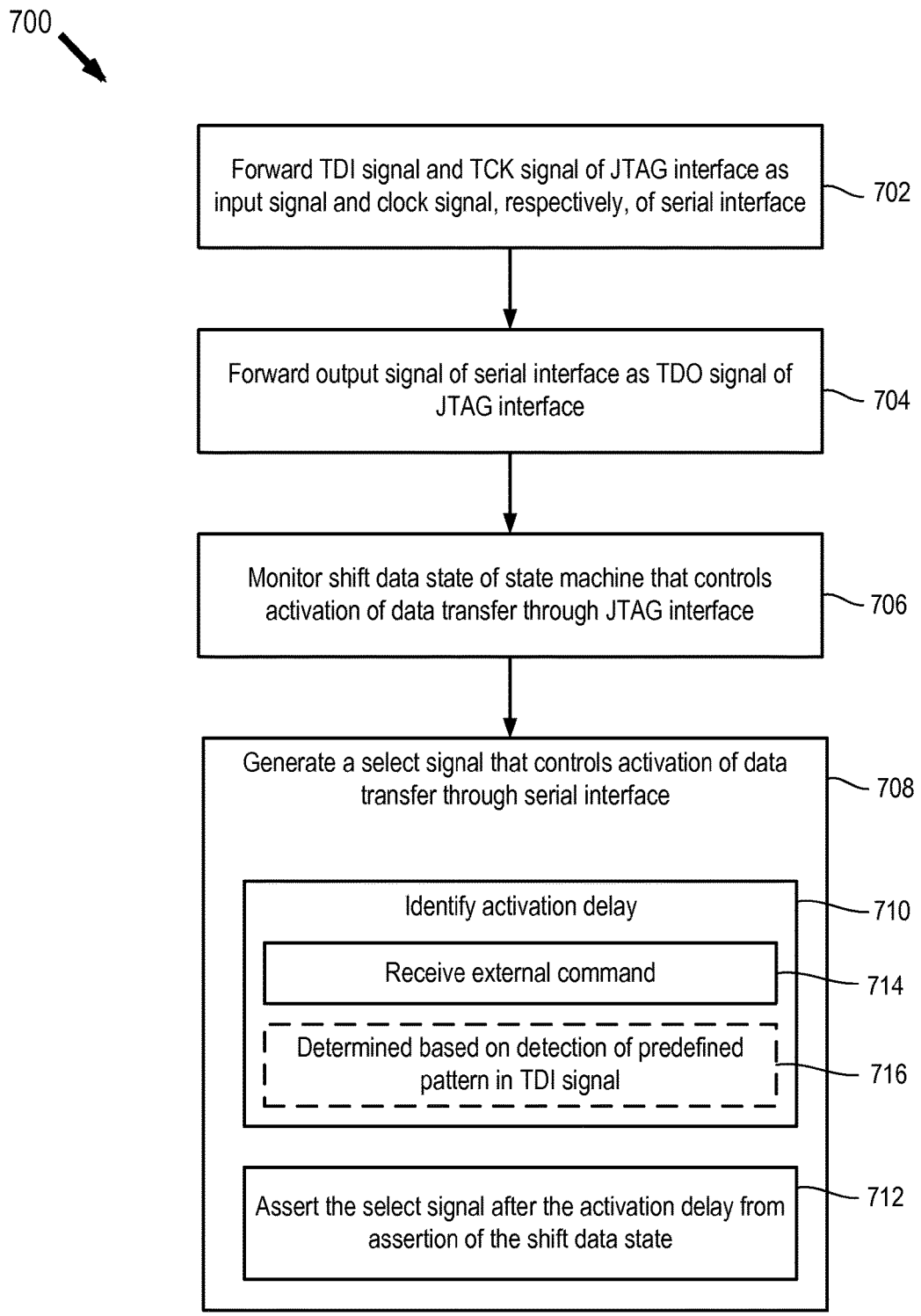
FIG. 7 is a flow diagram depicting a method of coupling a JTAG interface and a serial interface different from the JTAG interface in a device.

FIG. 7 is a flow diagram depicting an example method 700 of coupling a JTAG interface and a serial interface different from the JTAG interface in a device. The method 700 begins at step 702, where TDI and TCK signals of the JTAG interface are forwarded as input and clock signals, respectively, of the serial interface. At step 704, an output signal of the serial interface is forwarded as a TDO signal of the JTAG interface. At step 706, a shift data state of a state machine that controls activation of serial data transfer through the JTAG interface is monitored. At step 708, a select signal is generated that controls activation of serial data transfer through the serial interface. The step 708 can include steps 710 and 712. At step 710, an activation delay for the select signal is identified. At step 712, the select signal is asserted after assertion of the shift data state according to the activation delay. In one example, the step 710 can include a step 714, where an external command is received to provide the activation delay. In another example, the step 710 can include a step 716, where the activation delay is determined based on detection of a predefined pattern in the TDI signal. The predefined pattern can be transmitted once to determine the delay (e.g., calibration pattern), or transmitted as a header pattern each time data is to be provided to the SPI bus.

While the foregoing is directed to specific examples, other and further examples may be devised without departing from the basic scope thereof, and the scope thereof is determined by the claims that follow.

What is claimed is:

1. A circuit to couple a test access port (TAP) having a JTAG interface to another port having a serial interface different from the JTAG interface, the circuit comprising:
   a forwarding circuit that couples a test data in (TDI) terminal, a test data out (TDO) terminal, and a test clock (TCK) terminal of the TAP to an input terminal, an output terminal, and a clock terminal of the other port, respectively; and
   a timing control circuit coupled to drive a select terminal of the other port with a select signal that enables a device coupled to the other port;
   wherein the timing control circuit delays assertion of the select signal by a configurable time period after assertion of a shift data state of a state machine of the TAP, wherein the configurable time period is based on a number of slave JTAG devices in a chain of slave JTAG devices connected to the circuit.

2. The circuit of claim 1, wherein the serial interface comprises an SPI interface.

3. The circuit of claim 1, wherein:
   the timing control circuit includes a timer coupled to count clock cycles; and
   the timing control circuit asserts the select signal when a cycle count of the timer satisfies a threshold cycle count equivalent to the configurable time period.

4. The circuit of claim 3, wherein:
   the timing control circuit further includes an input terminal; and
   the timing control circuit sets the configurable time period in response to input data received from the input terminal.

5. The circuit of claim 3, wherein:
   the timing control circuit is coupled to the TDI terminal and includes a detector; and
   the detector is coupled to detect a predefined pattern in a TDI signal received from the TDI terminal and set the configurable time period based on detection of the predefined pattern.

6. The circuit of claim 1, wherein:
   the timing control circuit is coupled to the TDI terminal and includes a detector;
   the detector is coupled to detect a predefined pattern in a TDI signal received from the TDI terminal the configurable time period after assertion of the shift data state; and
   the detector is coupled to assert the select signal based on detection of the predefined pattern.

7. The circuit of claim 1, wherein:
   the select terminal is one of a plurality of select terminals of the another port; and
   the timing control circuit further comprises a selector circuit coupled to selectively couple the select signal to one of the plurality of select terminals.

8. The circuit of claim 1, wherein the timing control circuit is coupled to de-assert the select signal a configurable time period before de-assertion of the shift data state of the state machine of the TAP.

9. A slave JTAG device on a JTAG bus having a master JTAG device, the slave JTAG device coupled to another device on a serial bus different from the JTAG bus, the slave JTAG device comprising:
   a test access port (TAP) coupled to the JTAG bus;
   another port coupled to the serial bus; and
   a bus translator circuit coupled between the TAP and the other port, the bus translator circuit including:
      a forwarding circuit to couple a test data in (TDI) path, a test data out (TDO) path, and a test clock (TCK) path of the JTAG bus to an input path, an output path, and a clock path of the serial bus, respectively; and
      a timing control circuit coupled to a select path of the serial bus used to enable the other device, and further coupled to a controller in the TAP to access a shift data state of a state machine implemented by the controller;
      wherein the timing control circuit delays assertion of the select signal by a configurable time period after assertion of the shift data state, wherein the configurable time period is based on a number of slave JTAG devices in a chain of slave JTAG devices connected to the master JTAG device.

10. The slave JTAG device of claim 9, wherein:
    the other port comprises an SPI port; and
    the serial bus comprises an SPI bus.

11. The slave JTAG device of claim 9, wherein:
    the timing control circuit includes a timer coupled to count clock cycles; and
    the timing control circuit asserts the select signal when a cycle count of the timer satisfies a threshold cycle count equivalent to the configurable time period.

12. The slave JTAG device of claim 11, wherein:
    the timing control circuit is coupled to the master JTAG device; and
    the timing control circuit sets the configurable time period in response to a command received from the master JTAG device.

13. The slave JTAG device of claim 11, wherein:
    the timing control circuit is coupled to the TDI line of the JTAG bus; and
    the timing control circuit includes a detector coupled to detect a predefined pattern in a TDI signal received from the TDI line and set the configurable time period based on detection of the predefined pattern.

14. The slave JTAG device of claim 9, wherein:
    the timing control circuit is coupled to the TDI terminal and includes a detector;
    the detector is coupled to detect a predefined pattern in a TDI signal received from the TDI terminal the configurable time period after assertion of the shift data state; and
    the detector is further coupled to assert the select signal based on detection of the predefined pattern.

15. The slave JTAG device of claim 9, further comprising a field programmable gate array (FPGA).

16. The slave JTAG device of claim 15, wherein at least a portion of the bus translator is configured in programmable logic of the FPGA.

17. A method of coupling a JTAG interface and a serial interface different from the JTAG interface in a device, comprising:
    forwarding a test data in (TDI) signal and a test clock (TCK) signal of the JTAG interface as an input signal and a clock signal, respectively, of the serial interface;
    forwarding an output signal of the serial interface as a test data output (TDO) signal of the JTAG interface;

monitoring a shift data state of a state machine that controls data transfer through the JTAG interface; and generating a select signal that enables another device coupled to the serial interface for serial data transfer, the select signal being asserted a configurable time period after assertion of the shift data state, wherein the configurable time period is based on a number of slave JTAG devices in a chain of slave JTAG devices connected to the device.

18. The method of claim 17, further comprising:

setting the configurable time period in response to a command received by the device.

19. The method of claim 17, further comprising:

detecting a predefined pattern in the TDI signal; and setting the configurable time period based on elapsed time before detection of the predefined pattern.

20. The method of claim 17, further comprising:

detecting a predefined pattern in the TDI signal the configurable time period after assertion of the shift data state; and asserting the select signal in response to detection of the predefined pattern.

* * * * *

UNITED STATES PATENT AND TRADEMARK OFFICE
CERTIFICATE OF CORRECTION

PATENT NO. : 9,817,066 B1
APPLICATION NO. : 14/469046
DATED : November 14, 2017
INVENTOR(S) : Kuramoto et al.

It is certified that error appears in the above-identified patent and that said Letters Patent is hereby corrected as shown below:

The inventor whose name reads "Stephanie Trapp" should read -- Stephanie Tapp --.

Signed and Sealed this
Twentieth Day of February, 2018

Andrei Iancu
*Director of the United States Patent and Trademark Office*